United States Patent [19]

Lafaye

[11] Patent Number: 5,196,792
[45] Date of Patent: Mar. 23, 1993

[54] PROXIMITY DETECTOR HOUSING WITH ORIENTABLE HEAD

[75] Inventor: Michel Lafaye, Soyaux, France

[73] Assignee: Telemecanique, Rueil-Malmaison, France

[21] Appl. No.: 817,657

[22] Filed: Jan. 7, 1992

[30] Foreign Application Priority Data

Jan. 11, 1991 [FR] France ............................. 91 00290

[51] Int. Cl.$^5$ .............................................. G01B 7/14
[52] U.S. Cl. .................................. 324/207.16; 324/234;
324/246; 324/262; 361/180; 340/551
[58] Field of Search ..................... 324/207.11, 207.12,
324/207.14, 207.15, 207.16, 207.23, 207.26, 236,
234, 239, 260, 262, 261, 246; 331/65; 361/203,
180, 179; 73/866.5; 439/13; 200/303; 307/116,
124; 340/870.16, 870.31, 540, 541, 547, 551

[56] References Cited

U.S. PATENT DOCUMENTS

| | | | |
|---|---|---|---|
| 4,654,471 | 3/1987 | Masaki et al. | 174/50 |
| 4,703,264 | 10/1987 | Edwards | 324/220 |
| 4,704,524 | 11/1987 | Masaki et al. | 250/239 |
| 4,785,240 | 11/1988 | Newell et al. | 324/207.16 |
| 4,869,119 | 9/1989 | Bachand et al. | 73/866.5 |

FOREIGN PATENT DOCUMENTS

| | | |
|---|---|---|
| 0015497 | 9/1980 | European Pat. Off. |
| 7344278 | 4/1974 | Fed. Rep. of Germany |
| 2608755 | 6/1988 | France |
| 2611264 | 8/1988 | France |

Primary Examiner—Gerard R. Strecker
Assistant Examiner—Warren S. Edmonds
Attorney, Agent, or Firm—Young & Thompson

[57] ABSTRACT

A detector having a housing (12), a mounting (3) which is able to adopt four orientations relative to the housing (12), and a detector head (4) which is able to adopt, relative to the mounting (3), two orientations in one of which a sensitive face (29) of the head is oriented laterally relative to the axis (Z) of the housing (12), while in the other orientation the sensitive face (29) is centered on the axis (Z). The mounting (3), which can be separated from the housing (12), can engage through either of two recessed faces (33, 34) of the head, by the sliding of slideways (56) of the mounting between a base (38) and protuberances (43) of the head. The position of association of the head relative to the mounting is defined by the abutment of faces (48) of the protuberances (43) against stop faces (57) of the mounting. A pivot (18) of the mounting is then fixed in an aperture (22) of the housing. This mounting is used in order to eliminate screw fixings.

17 Claims, 5 Drawing Sheets

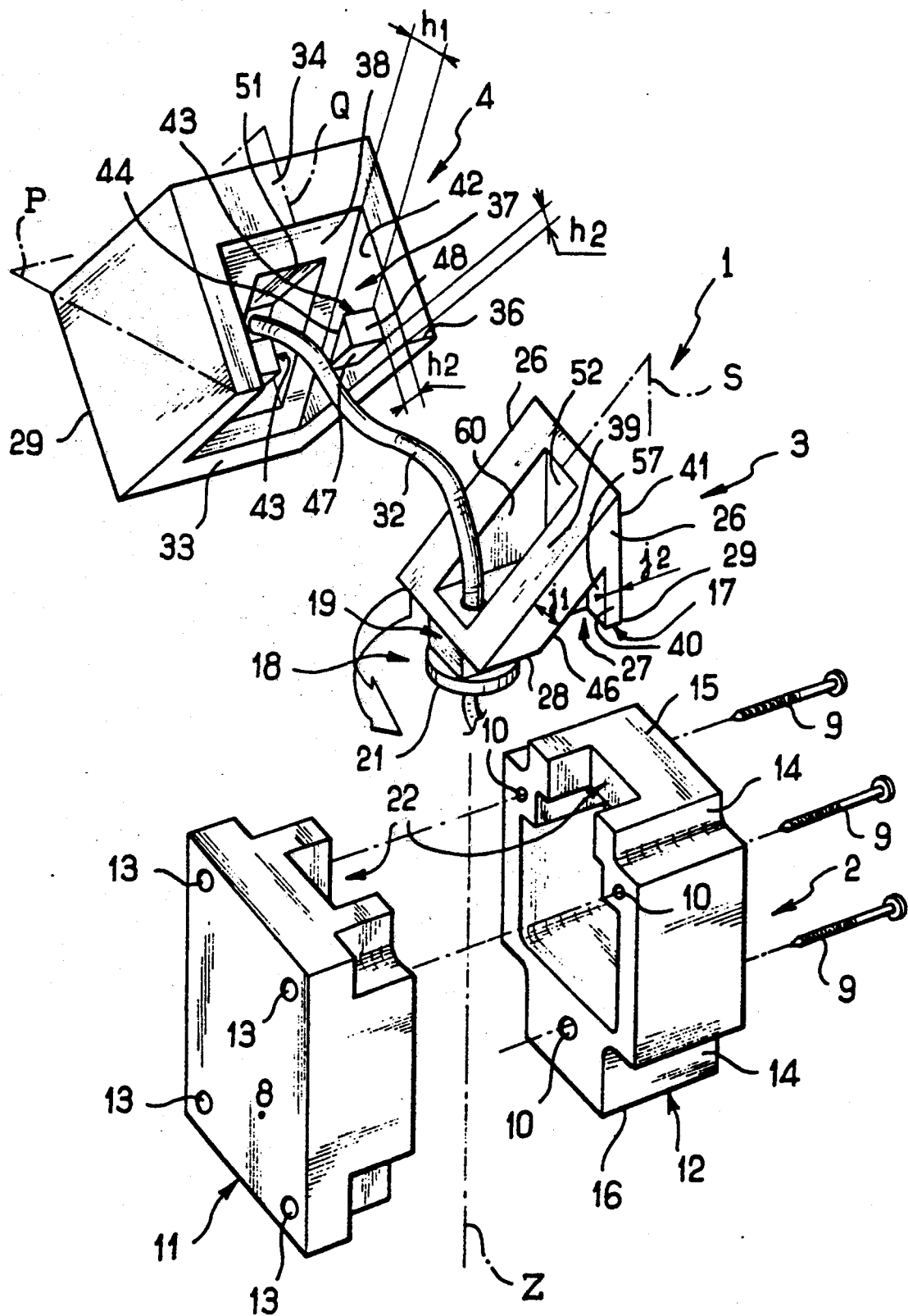
FIG_1

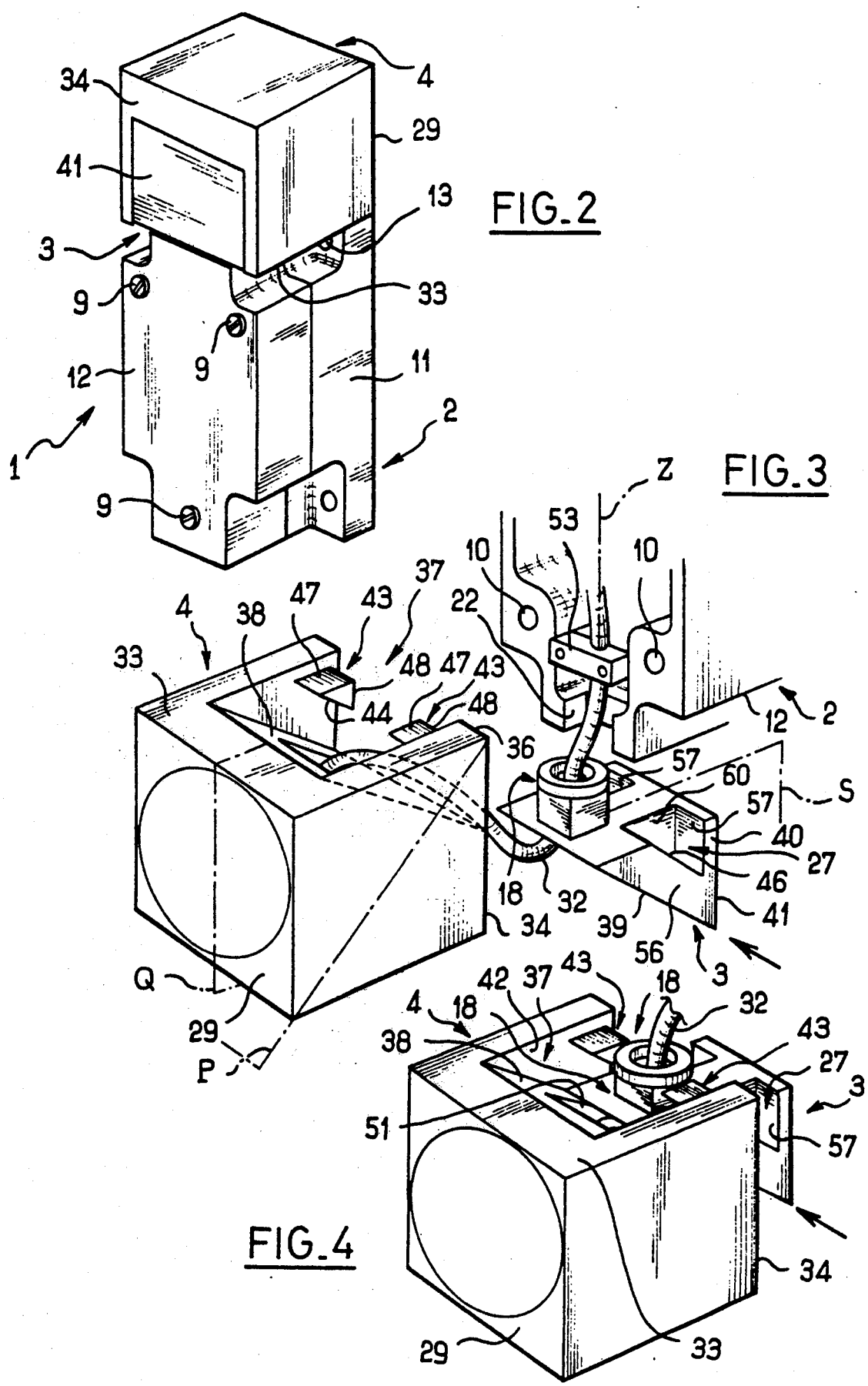

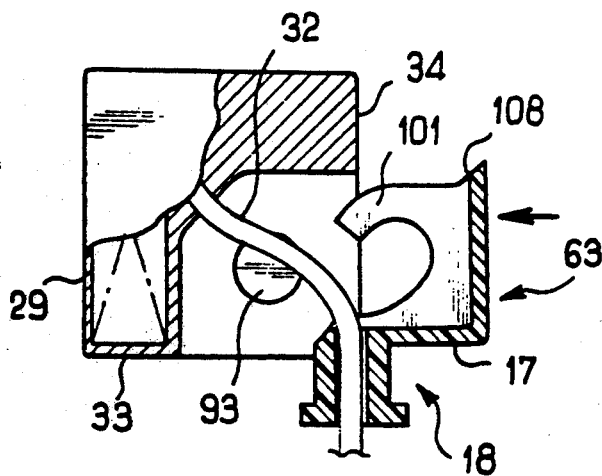
FIG_12
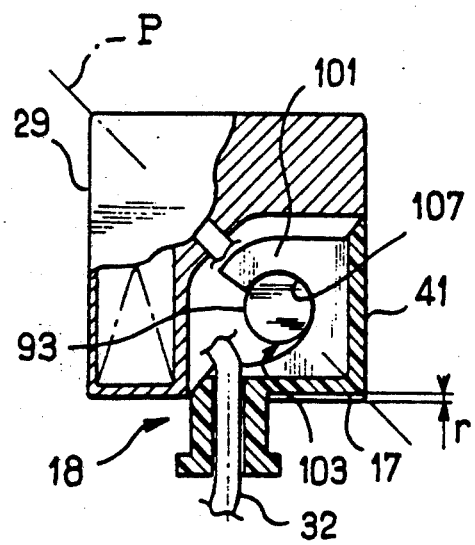
FIG_15
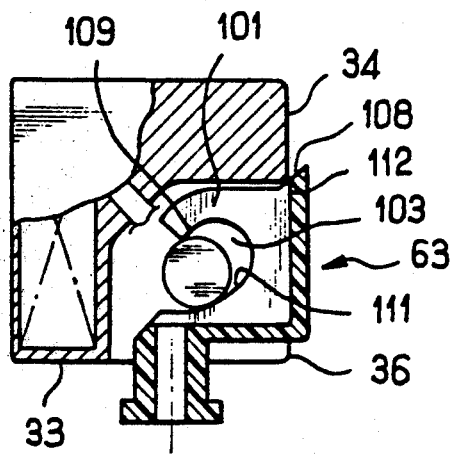
FIG_13
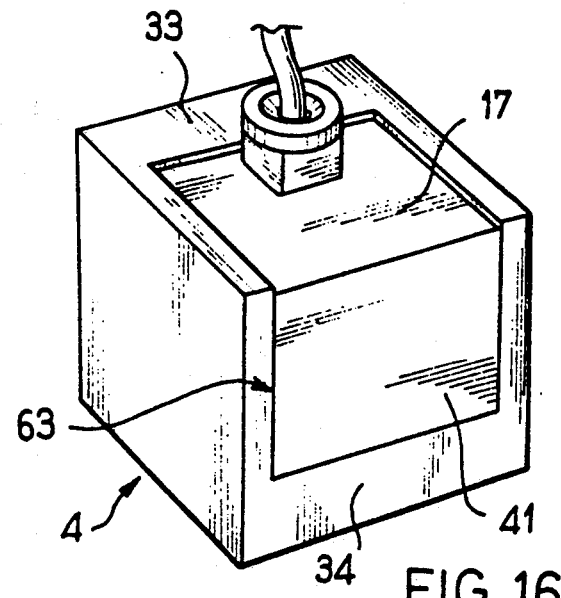
FIG_16
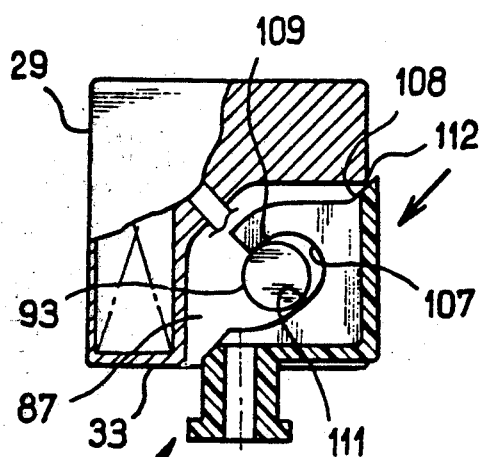
FIG_14
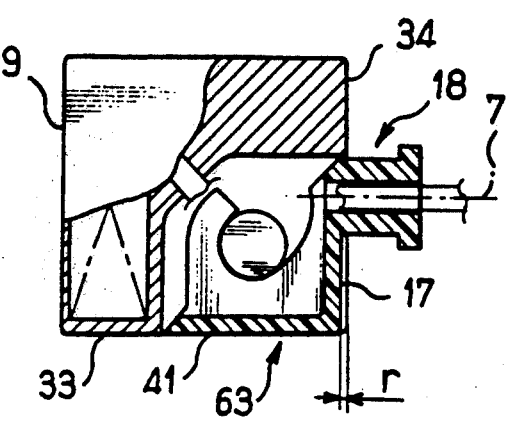
FIG_17

PROXIMITY DETECTOR HOUSING WITH ORIENTABLE HEAD

FIELD OF THE INVENTION

The present invention relates to a proximity detector whose head is orientable so that its sensitive face has a frontal orientation or, on the contrary, a selected one of a plurality of lateral orientations.

BACKGROUND OF THE INVENTION

Such detectors, which are principally used in installations or machinery in which it is necessary to know the position of a movable metal article or piece, may be fixed on a support having, relative to the movement of that article, one of, for example, five particular orientations, one corresponding to the frontal orientation of the sensitive face and the others to the various lateral orientations of the sensitive face. The provision of such detectors is thus advantageous for the manufacturer, who can make his production operation cost-effective in this way, and for the user in so far as he need only have available a single stock of replacement detectors.

Proximity detectors are already known, for from DE-U-73 44 278 or FR-A-2 608 755, which comprise a housing, a mounting which can be positioned on the housing in a selected one of a plurality of orientations about an axis, and a detector head which can be associated with the mounting in a selected one of two orientations. In one of these two orientations, the sensitive face is frontal so that the direction of detection is parallel to said axis. In the other of the two abovementioned orientations, the sensitive face is lateral, so that the direction of detection is, relative to the axis, a radial direction determined by the orientation of the mounting about the axis. The detector head has the shape of a cube with a recess for receiving the mounting.

According to these documents, the detector head is fixed to the mounting by screws. However, the screw fixings occupy space in the head, especially since the threads need to be relatively long in order to be strong. This thread length increases the fitting time. Moreover, if the thread is damaged, fitting is no longer possible.

A detector is also known from FR-A-2 611 264 whose two-part mounting can lock the head in the various orientations envisaged There are no longer any screws between head and mounting, but on the other hand the two mounting parts are screwed one to the other.

SUMMARY OF THE INVENTION

The object of the invention is thus to provide a proximity detector having an orientable head in which the number of screw fixings is particularly small.

The invention relates to a detector comprising a housing, a mounting provided with means for positioning on the housing in a selected one of a plurality of orientations about an axis, and a cubic detector head which, for receiving the mounting, comprises a recess extending over two recessed faces having a common edge and may be associated with the mounting in two positions of association, in each of which the positioning means are adjacent to one of the recessed faces which is intended to be adjacent to the housing.

According to the invention, the detector is a detector wherein the mounting can be separated from the housing and, once separated from the housing, can be engaged in the recess by each of the recessed faces and be displaced in the recess until inter-engagement of stop means of the head and of the mounting which define the selected position of association, in which the positioning means are adjacent to the recessed face other than that by which the mounting has been engaged.

Thus, there is no longer any need for fixing screws to connect the head to the mounting, and the mounting has no need to be in a plurality of pieces requiring to be screwed to one another.

Once the mounting has been engaged, by one or other of the two recessed faces of the head, depending on whether the detection face is to have a frontal or lateral orientation, the mounting is moved in the head until inter-engagement of the stop means. At this stage, the means of positioning the mounting in the housing are adjacent to the other recessed face of the head and can be associated with the housing. This having been done, the stop means prevent the head from moving relative to the mounting in the direction corresponding to the abovementioned engagement, and the bearing of the head against the housing prevents the relative movement in the opposite direction.

For the removable attachment of the mounting to the housing, various solutions may be resorted to, whereof the prior art provides examples Preferably, however, in order further to reduce the number of screw fixings in the detector, the positioning means are inserted between two elements of the housing and comprise at least one shoulder bearing against a face of the housing in order to prevent the mounting from moving away from the housing parallel to the axis when the positioning means are inserted between the two elements of the housing.

Thus, the mere fact of associating the two elements of the housing with each other while inserting the positioning means of the mounting between them is sufficient to retain the mounting in an appropriate position on the housing.

BRIEF DESCRIPTION OF THE DRAWINGS

Other features and advantages of the invention will also become apparent from the description which follows and relates to non-limiting examples.

In the attached drawings:

FIG. 1 is an exploded perspective view of a proximity detector according to the invention;

FIG. 2 is a perspective view of the detector in the fitted state;

FIGS. 3 to 5 are partial perspective views illustrating three stages of the fitting of the head on the mounting, with cut-aways;

FIGS. 12 to 15 are four views in median section showing four stages of the positioning of the head on the mounting of the second embodiment, with lateral orientation of the sensitive face;

FIG. 16 is a perspective view of the head and of the mounting in the assembled state; and FIG. 17 is a view similar to FIG. 15 but with frontal orientation of the sensitive face.

DETAILED DESCRIPTION OF THE INVENTION

Figure 5:
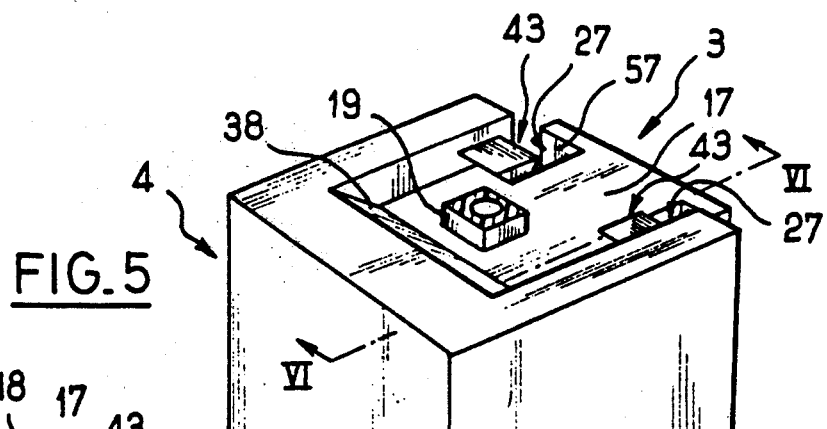
Figure 6:
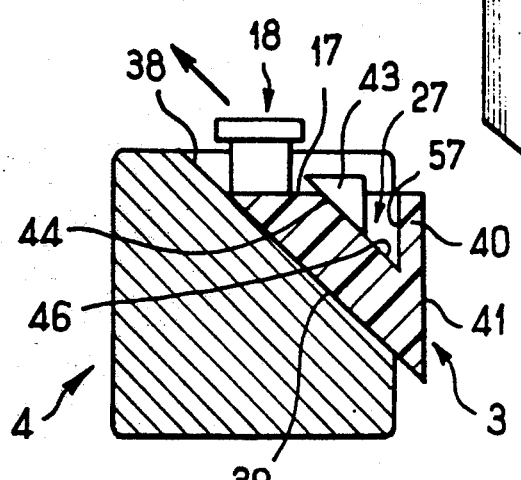
FIG. 6 is a view in section along VI—VI in FIG. 5.

In the example shown in FIGS. 1 and 2, the proximity detector 1 according to the invention essentially comprises a housing 2, an orientable attachment mounting 3 and a detector head 4.

The housing 2 is of generally parallelepipedal shape, having two end faces 15 and 16 which are of generally square shape, although each reduced by two recesses 14. The end face 15 is adjacent to the mounting 3. One axis 2 of the parallelepipedal housing passes orthogonally through the faces 15 and 16 at the center thereof.

The housing 2 comprises a body 11 and a lid 12 which are mutually separable along a plane containing the axis Z, in order to provide access to an internal connector, which is not shown, since its nature is well known. Screws 9 occupying parallel channels 10 fix the lid 12 on the body 11 in the position of use. The body comprises, for its attachment to a support (not shown) such as a machine frame, holes 13 each extending between one of the recesses 14 and a base surface 8 of the body 11, opposite the lid 12 and bearing against the support in the position of use.

The mounting 3 has, on its base surface 17, which in the position of use is turned towards the end face 15 of the housing 2, positioning means 18 comprising a pivot 19 of square section and of axis Z, this pivot 19 extending between the face 17 and an overlapping collar 21.

The square pivot can be received in a corresponding square aperture 22 made through the end face 15 of the housing 2. The aperture 22 belongs half to the body 11 and half to the lid 12.

Thus, when the body 11 and the lid 12 are attached one to the other, it is possible to insert the positioning means 18 between them with four different orientations about the axis Z, and thus to impart to the mounting 3 a selected one of four different orientations about the axis Z relative to the base surface 8 of the body 11.

Figure 8:
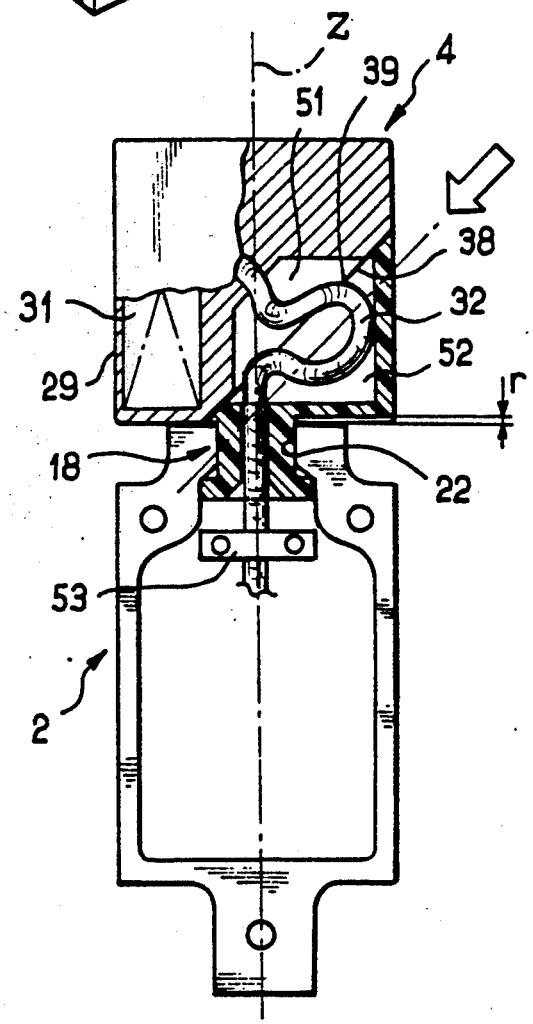
FIG. 8 is a view of the detector in the fitted state, in section along the plane of separation of the body and of the lid of the housing.
Figure 9:
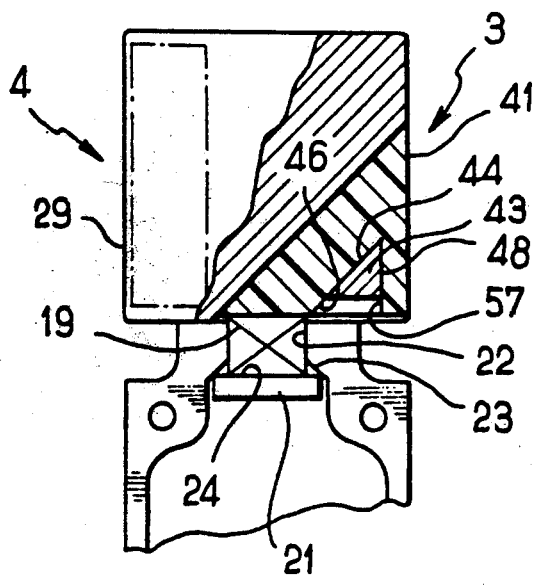
FIG. 9 is a partial view similar to FIG. 8, but in which the plane of section of the head and of the mounting is offset towards the observer.

As FIGS. 8 and 9 show, the aperture 22 in the housing 2 opens, towards the interior of the housing 2, via a frustoconical surface 23. A planar shoulder 24 of the collar 21 bears on the frustoconical surface 23, while the square pivot 19 is fitted tightly into the aperture 22.

The frustoconical shape of the surface 23 has, relative to a surface which would be planar and perpendicular to the axis Z, the advantage of making it possible easily to engage the collar 21 under this surface when the body 11 and the lid 12 are brought towards one another. Subsequently to this, the mutual bringing-together of the body 11 and of the lid 12 by tightening of the screws 9 produces, via this frustoconical face, a traction on the positioning means 18 exerted parallel to the axis Z towards the interior of the housing, in a manner such as to take up the plays and tolerances between the housing 2 and the assembly formed by the mounting 3 and the head 4.

As FIG. 1 shows, the mounting 3 has a generally prismatic shape, having two opposite end faces 26 of the general shape of a right isosceles triangle. Two opposite edges 28 of the base surface 17 of the mounting 3 each form one of the sides of the right angle 29 of one of the faces 26. Each edge 28 is interrupted by a prismatic recess 27 opening into the face 17 and into one of the faces 26, and the prism faces of said recess are parallel to those of the mounting 3. Two slideways 56 are each defined between the oblique prism face 39 of the mounting 3 and the oblique prism face 46 of one of the recesses 27.

The detector head 4 is of generally cubic shape. As FIG. 8 shows, it encloses behind one of its faces, called the sensitive face 29, a device such as a coil 31 whose electrical behavior varies when a metal article passes in front of the sensitive face 29. This type of device, and also the manner in which it is fitted in a head of generally cubic shape such as the head 4, are well known and will not be described in detail. It will simply be recalled that the device 31 must be connected to the interior of the housing 2 by a wire 32 serving to supply current to the device 31 and to transmit the signals supplied by the device 31.

Returning to FIG. 1, the head 4 additionally comprises two recessed faces 33 and 34 of which one, 33, is adjacent to the face 29 and the other, 34, is opposite to the face 29. The faces 33 and 34 have a common edge 36 which is interrupted by a recess 37 having a generally prismatic shape and being substantially of the same dimensions and same configuration as the generally prismatic shape of the mounting 3.

Thus, the recess 37 has an oblique base 38 having a rectilinear profile oriented at 45° relative to the recessed faces 33 and 34 and corresponding to an oblique face 39 of the mounting 3 which has a corresponding rectilinear profile, that is to say is disposed at 45° relative to the face 17 and to a closing face 41 of the mounting 3.

The recess 37 additionally has two opposite end faces 42 in the shape of a right isosceles triangle, situated in planes perpendicular to the common edge 36 and corresponding to the end faces 25 of the mounting 3.

The end faces 42 each carry stop means comprising a prismatic protuberance 43 having prism faces which are parallel to the prism faces of the recess 37, with an oblique face 44 situated opposite the base 38. The distance h1 between the oblique face 44 and the base 38 is substantially equal to the distance j1 between the oblique face 39 of the mounting 3 and the parallel oblique face 46 of the recesses 27. Each protuberance 43 further comprises two orthogonal faces 47 and 48 which are parallel to the faces 33 and 34 respectively and offset relative thereto, towards the interior of the recess 37, by a distance h2 equal to the thickness j2 of two walls 40 which contribute to defining the closing face 41, and on the backs of which are molded the faces 57 of the recesses 27 which are parallel to the closing face 41. The protuberances 43 are arranged facing each other and at a distance from each other.

Furthermore, the base 38 and the oblique face 39 of the mounting 3 and of the recess 37 each comprise a seating 51, 52 for receiving a certain length of the wire 32 which, coming from the device 31 (FIG. 8), passes through the common plane of the faces 38 and 39 and passes slidingly through the positioning means 18 to a cable clamp 53 arranged within the lid 12.

Having regard to what has just been described, it is apparent that the recess 37 and protuberances 43 are symmetrical relative to a plane P (FIG. 1) containing the edge 36 and bisecting the recessed faces 33 and 34, and also relative to a median plane Q of the cube of the head 4, the plane Q being perpendicular to the edge 36. The mounting 3 is itself symmetrical relative to a plane S which is parallel to the faces 26 and equidistant between them.

A description will now be given of the mode of assembly of the detector, which at the same time constitutes the mode of selecting the orientation of the sensitive face 29 relative to the base face 8 of the body 11 of the housing 2.

As FIG. 3 shows, the mounting 3 is presented opposite one 34 of the recessed faces 33 and 34 of the head 4. In the example shown, where it is desired that the sensitive face 29 should have a lateral orientation, the mounting 3 is presented confronting the recessed face 34 opposite to the sensitive face 29. Having regard to symmetry relative to the plane P, it is apparent that the head 4 could be rotated through 180° so as to transpose the positions of the faces 33 and 34 without changing any aspect of what will be stated below, except that the sensitive face 29 will be perpendicular to the axis Z instead of being parallel thereto, in a manner such as to impart a frontal instead of lateral orientation to the sensitive face.

The mounting 3 is presented so that its oblique face 39 is substantially in the same plane as the base 38 of the recess 37, and so that the oblique faces 46 of the recesses 27 are aligned with the oblique faces 44 of the protuberances 43.

Figure 7:
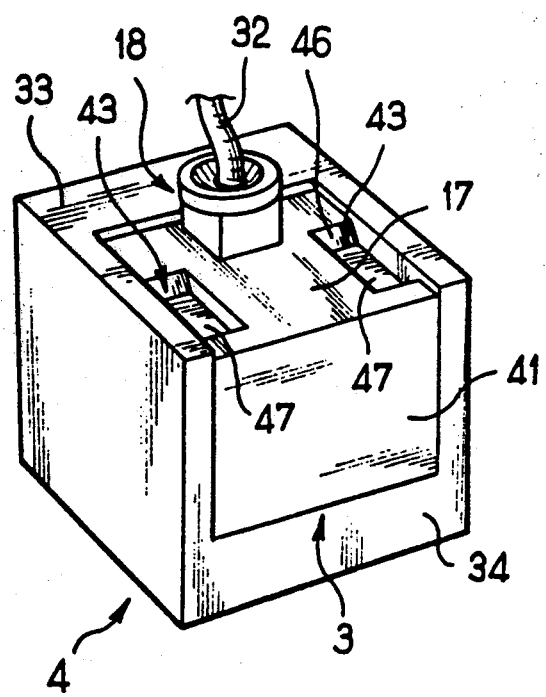
FIG. 7 is a view of the head and of the mounting in the assembled state, in perspective, at an angle different from that of FIGS. 3 to 5.

From this situation, as shown in FIG. 4, the mounting 3 is moved relative to the head 4 in a direction parallel to the base 38 of the recess 37 to engage the slideways 56 between the base 38 and the faces 44. The slideways 56 slide between the base 38 and the faces 44, while the positioning means 18, entraining with them the wire 32, pass between the end faces, which are set apart, of the protuberances 43. This sliding takes place until, as shown in FIGS. 7 and 8, the faces 57 of the recesses 27 come to abut against the faces 48 of the protuberances 43. Thus, the faces 57 and the protuberances 43 constitute stop means which limit the sliding travel of the mounting 3 through the head 4. As is shown in FIGS. 2 and 7 to 9, in this position, called the "position of association", the closing face 41 is substantially in the same plane as the recessed face 34 remote from the means 18, and substantially closes the face 34. On the other hand, the base face 17 of the mounting 3 has a slight set-back r (FIG. 8) relative to the recessed face 33 of the head 4. Moreover, lateral walls 60 of the seating 52 are situated between the protuberances 43.

At this stage the positioning means 18 are placed between the body 11 and the lid 12, which have not yet been assembled, and the body 11 and the lid 12 are assembled by means of the screws 9 which, having regard to the effect of the frustoconical surface 23 (FIG. 9) pulls the mounting 3/head 4 assembly against the face 15 of the housing 2 and, consequently, causes the recessed face 33 of the head 4 to bear against said face 15, since the base face 17 of the mounting 3 is set back relative to the recessed face 33. In this manner, the head 4 is firmly clamped against the face 15 and the head is immobilized relative to the housing 2.

More specifically, the end faces 42 of the recess 37 in the head 4 are caused to bear against the end faces 26 of the mounting 3, which prevents the head from moving laterally and also from rotating about the axis Z relative to the mounting. The mutual bearing of the faces 33 and 15 likewise prevents the head from rotating about any other axis, nor can the head move parallel to the edge 28 of the mounting, having regard to the bearing of the base 38 of the recess against the face 39, and of the oblique faces 44 of the protuberances 43 against the oblique faces 46 of the recesses 27.

The sliding guidance between the head and the mounting, in a direction at 45° relative to the face 33 bearing on the housing 2, takes place as a result of a long contact between the base 38 and the oblique face 39, which prevents the mounting from pivoting slightly relative to the head about an axis parallel to the common edge 36 under the effect of the traction exerted on the positioning means 18.

Finally, the head 4, from its position of association, is strictly guided to slide obliquely, parallel to the face 38 relative to the mounting 3, but, once the head/mounting assembly has been fixed to the housing, this sliding is prevented, in one direction by mutual abutment of the protuberances 43 and of the stop faces 57, and in the other direction by mutual bearing between the faces 33 and 15.

The shoulder 24 of the collar 21 prevents the mounting 3, and consequently the head 4, from moving away from the housing along the axis Z. Nor can the mounting move towards the housing, having regard to the bearing between the oblique faces 44 of the protuberances 43 and the oblique faces 46 of the recesses 27. Moreover, the square shape of the pivot 19 fitted into the corresponding square aperture 22 of the housing 2 prevents the mounting and the head from rotating, in particular about the axis Z, and from moving laterally.

Having regard to all the foregoing, the fitting is such that the four constituent parts, the body 11, the lid 12, the mounting 3 and the head 4, are firmly immobilized relative to one another when the screws 9 are tightened.

By the use of stop means 43 which are symmetrical relative to the plane Q (FIG. 3), and spaced on either side of this plane, a stable bearing is provided between the mounting 3 and the head 4, while the wire 32 is permitted to circulate between the protuberances 43 during fitting.

Figure 10:
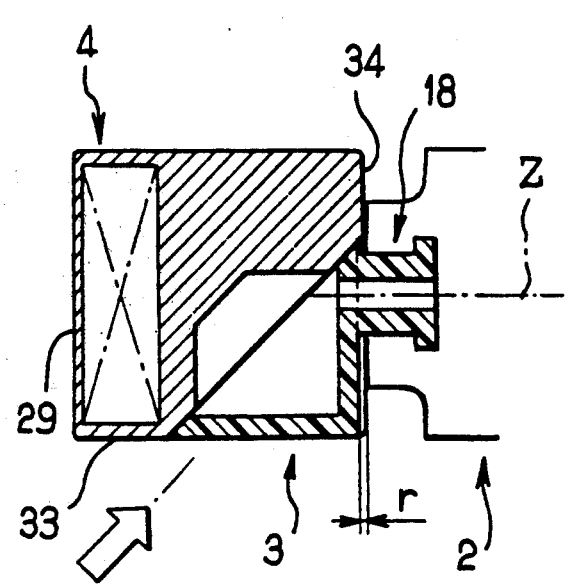
FIG. 10 is a partial view, similar to FIG. 8, but in which the sensitive face of the head has its frontal instead of lateral orientation.
Figure 11:
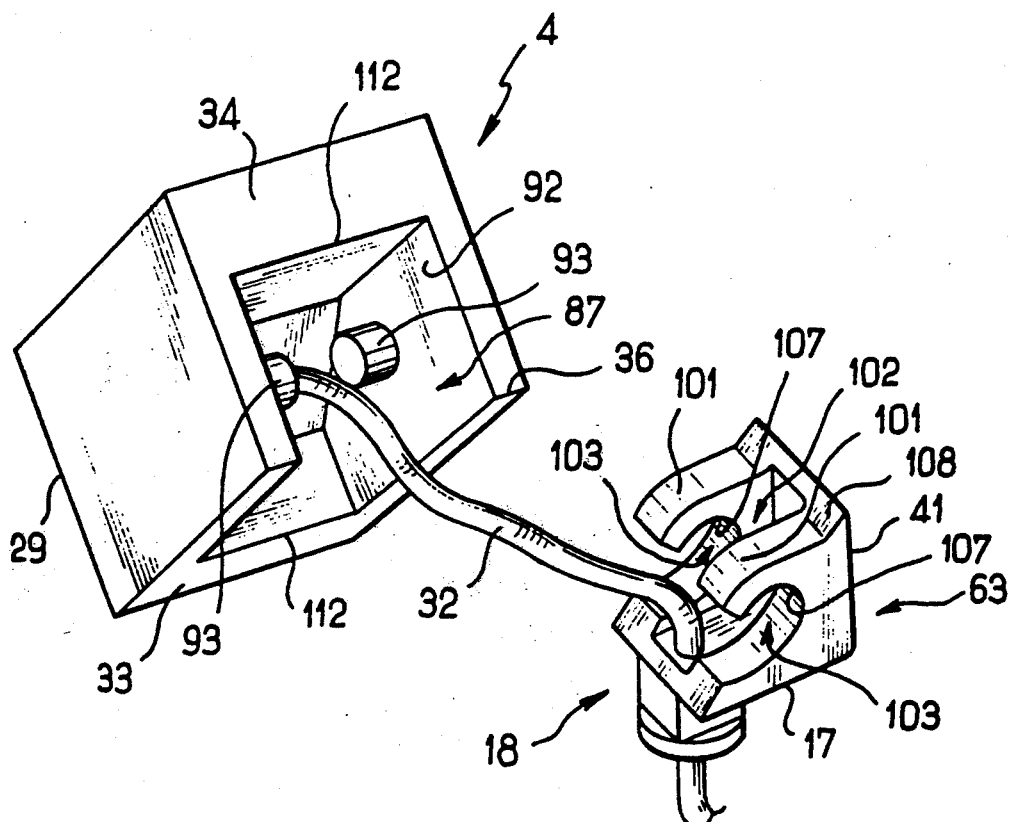
FIG. 11 is a view similar to the upper part of FIG. 1 but corresponding to a second embodiment.

As FIG. 10 shows, and as already stated above, the mounting 3 may be engaged through the recessed face 33 which is adjacent to the sensitive face 29, so that the positioning means 18 are then adjacent to the recessed face 34 which is opposite the sensitive face 29, which then has a frontal orientation relative to the housing 2. In this case, and in a manner which is not shown, it will be the faces 47, and no longer the faces 48, of the stop protuberances 43 which will abut against the stop faces 57 of the mounting 3 to limit the sliding of the mounting 3 through the head 4 when the position of association is reached.

The embodiment shown in FIGS. 11 to 17 will be described only in terms of its differences from the preceding embodiment.

The mounting 63 has the general shape of an angle iron, one of whose wings carries on its outer face—or base face—17 the unchanged positioning means 18, while the other wing carries on the outside the closing face 41, likewise unchanged, and on the inside two parallel hooks 101 defining between them a seating 102 for the wire 32. The hooks 101 partially surround grooves 103 whose bottom 107 forms a stop means.

The recess 87 has end faces 92 of pentagonal shape which carry, as fastening and stop means, two opposed and spaced cylindrical protuberances 93, each of which is intended to be received by one of the grooves 103.

As FIG. 12 shows, for assembly the mounting 63 is engaged as in the previous example through the recessed face 34 other than that 33 which is to be adjacent to the positioning means 18, having regard to the orientation, lateral in this case, desired for the sensitive face 29. The hooks 101 are engaged behind the protuberances 93 by a movement which is perpendicular to the recessed entry face 34, until an oblique face 108, oriented at 45°, of the mounting 63 abuts against the rim 112, parallel to the common edge 36 (FIG. 13), of the recess 87. At this stage, each protuberance 93 is facing the groove 103 of the corresponding hook 101, and the protuberance 93 can slide between a 45° face 109 of the hook 101 and a face 111 provided on the mounting 63, parallel to the face 109 and facing the latter.

Thus, as shown in FIG. 14, the following step is a displacement through 45° by sliding of the protuberance 93 between the faces 109 and 111 and sliding of the face 108 against the rim 112 of the recess 87. This sliding movement, in a direction forming an angle relative to the recessed face 33 to which the positioning means 18 are finally to be adjacent, is continued until the protuberances 93 (FIG. 15) abut against the stop surfaces 107 at the bottom of the grooves 103.

At this stage, the position of association has been reached, as shown in FIG. 16. In this position, as in the previous example, the closing face 41 is in the plane of the corresponding recessed face 34 of the head 4, while the base face 17 is slightly set back relative to the other recessed face 33.

The association between the head/mounting assembly thus produced and the housing 2 (not shown) takes place as in the previous example.

FIG. 16 shows that in this example of embodiment, the base face 17 is not affected by recesses such as the recesses 27 in FIG. 1.

As shown in FIG. 17, here again, it is possible to engage the mounting 63 through the recessed face 33 in order for the positioning means 18 to be finally adjacent to the recessed face 34, so that the sensitive face 29 has its frontal orientation.

Of course, the invention is not restricted to the examples described and shown.

It would, for example, be possible to provide a simpler attachment between the head and the mounting, while certain means for immobilizing the head would be obtained by the interaction of appropriate shapings of the head and of the housing, in particular in order to prevent the lateral movements of the head relative to the housing.

I claim:

1. A proximity detector comprising a housing (2), a mounting (3, 63) provided with means (18) for positioning on the housing (2) in a selected one of a plurality of orientations about an axis (Z) and one orientation perpendicular to the axis (Z), and a cubic detector head (4) which, for receiving the mounting, comprises a recess (37, 87) extending over two recessed faces (33, 34) having a common edge (36) and may be associated with the mounting (3, 63) in two positions of association, in each of which the positioning means (18) are adjacent to one of the recessed faces (33, 34) which is intended to be adjacent to the housing (2), wherein the mounting (3, 63) can be separated from the housing (2) and, once separated from the housing, can be engaged in the recess (37, 87) by each of the two recessed faces (33, 34) and be displaced in the recess until inter-engagement of stop means (43, 57; 93, 107) of the head (4) and of the mounting (3, 63) which define the selected position of association, in which the positioning means (18) are adjacent to the recessed face (34, 33) other than that (33, 34) by which the mounting has been engaged.

2. The detector as claimed in claim 1, wherein the positioning means (18) are inserted between two elements (11, 12) of the housing (2) and comprise at least one shoulder (24) bearing against a face (23) of the housing (2) in order to prevent the mounting (3, 63) from moving away from the housing parallel to the axis (Z) when the positioning means (18) are inserted between the two elements (11, 12) of the housing.

3. The detector as claimed in claim 2, wherein the shoulder (24) is carried by an end collar (21) of the positioning means (18).

4. The detector as claimed in claim 1, wherein the mounting (3, 63) comprises, in the vicinity of the positioning means (18) a face (15) which, when the stop means (43, 57; 93, 107) are inter-engaged, has a set-back (r) relative to the recessed face (33) to which the positioning means (18) are adjacent.

5. The detector as claimed in claim 1, wherein the recess (37, 87) interrupts the common edge (36), and wherein a connecting wire (32) between the housing (2) and the head (4) is guided through the mounting (3, 63).

6. The detector as claimed in claim 1, wherein the stop means (43, 93) of the head (4) are arranged symmetrically on either side of a plane (Q) perpendicular to the common edge (36).

7. The detector as claimed in claim 1, wherein the recess (37, 87) and the mounting (3, 63) have mutual bearing faces (42, 26; 92) which prevent the head (4) from moving relative to the mounting (3, 63) parallel to the common edge (36) when the head is in the position of association on the mounting.

8. The detector as claimed in claim 1, wherein the head (4) and the mounting (3, 63) possess mutual guidance means (38, 39; 44, 46; 108, 112; 109, 111, 93) which are operative at least in the vicinity of the position of association in order to permit the head, relative to the mounting, only a movement which is directed at an angle relative to the recessed face (33, 34) to which the positioning means (18) are adjacent.

9. The detector as claimed in claim 8, wherein the angle is substantially equal to 45°.

10. The detector as claimed in claim 8, wherein the mutual guidance means (38, 39; 44, 46; 108, 112; 109, 111, 113) are arranged to prevent the head from pivoting relative to the mounting about an axis parallel to the common edge (36).

11. The detector as claimed in claim 8, wherein, in its movement of engagement and displacement in the head (4), the mounting (3) is guided in a sliding manner between a base (38) of the recess and the stop means (43) of the head.

12. The detector as claimed in claim 11, wherein the base (38) of the recess (37) has a rectilinear longitudinal profile oriented at 45° relative to the recessed faces (33, 34) and, during engagement and displacement, the mounting (3) bears on the base (38) of the recess by a face (39) which has a corresponding rectilinear longitudinal profile.

13. The detector as claimed in claim 12, wherein the stop means (43) of the head (4) have a profile in the shape of a right isosceles triangle with a face (44) parallel to the base (38).

14. The detector as claimed in claim 11, wherein the stop means (57) of the mounting (3) are arranged on the back of a wall (40) which contributes to defining a closing face (41) which is positioned in the plane of the recessed face (34, 33) remote from the positioning means (18), and substantially closes the latter when the head (4) is in the position of association on the mounting.

15. The detector as claimed in claim 11, wherein the stop means of the head comprise two protuberances (43) directed towards one another in the recess (37) and between which a part (60) of the mounting (56) extends when the head is in the position of association on the mounting.

16. The detector as claimed in claim 1, wherein the mounting (63) has the general shape of an angle iron, one of whose wings carries the positioning means (18) on its outer face (15) while the other wing carries, on its inner face, a fastening means (101) carrying, at least in part, the stop means (107) of the mounting and intended to interact with a complementary fastening means (93) provided in the recess (87).

17. The detector as claimed in claim 1, wherein the mounting (63) has the general shape of an angle iron, one of whose wings carries the positioning means (18) on its outer face (15) while the other wing carries, on its inner face, two fastening means (101) carrying, at least in part, the stop means (107) of the mounting (63) and intended to interact with two complementary fastening means (93) provided in the recess (87), the fastening means being mutually spaced in order to provide between them a seating (102) for receiving the connecting wire (32) running from the mounting (63) to the head (4).

* * * * *